(12) United States Patent
Chen et al.

(10) Patent No.: US 8,563,336 B2
(45) Date of Patent: Oct. 22, 2013

(54) METHOD FOR FORMING THIN FILM RESISTOR AND TERMINAL BOND PAD SIMULTANEOUSLY

(75) Inventors: Fen Chen, Williston, VT (US); Jeffrey P. Gambino, Westford, VT (US); Zhong-Xiang He, Essex Junction, VT (US); Tom C. Lee, Essex Junction, VT (US); John C. Malinowski, Jericho, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 632 days.

(21) Appl. No.: 12/342,430

(22) Filed: Dec. 23, 2008

(65) Prior Publication Data

US 2010/0155893 A1    Jun. 24, 2010

(51) Int. Cl.
*H01L 21/00*    (2006.01)
(52) U.S. Cl.
USPC .............. 438/21; 438/50; 438/238; 438/330; 438/382; 438/384; 257/537; 257/E21.006; 257/E21.535; 257/E27.116
(58) Field of Classification Search
None
See application file for complete search history.

(56) References Cited

U.S. PATENT DOCUMENTS

| | | | |
|---|---|---|---|
| 3,862,017 A * | 1/1975 | Tsunemitsu et al. | ........... 205/124 |
| 3,988,214 A | 10/1976 | Tsunemitsu | |
| 4,763,184 A | 8/1988 | Krieger et al. | |
| 4,884,053 A | 11/1989 | Bougger | |
| 4,926,542 A | 5/1990 | Bougger | |
| 4,990,802 A | 2/1991 | Smooha | |
| 5,162,896 A | 11/1992 | Takubo et al. | |
| 5,227,655 A | 7/1993 | Kayama | |
| 5,254,493 A * | 10/1993 | Kumar | ............................ 216/16 |
| 5,291,123 A | 3/1994 | Brown | |
| 5,302,911 A | 4/1994 | Miyashita | |
| 5,304,839 A | 4/1994 | Chen et al. | |
| 5,414,380 A | 5/1995 | Floyd et al. | |
| 5,502,328 A | 3/1996 | Chen et al. | |
| 5,559,659 A | 9/1996 | Strauss | |
| 5,581,432 A | 12/1996 | Wellnitz et al. | |
| 5,615,073 A | 3/1997 | Fried et al. | |
| 5,739,707 A | 4/1998 | Barraclough | |
| 5,745,149 A | 4/1998 | Park et al. | |
| 5,767,575 A | 6/1998 | Lan et al. | |
| 5,796,746 A | 8/1998 | Farnworth et al. | |
| 5,838,033 A | 11/1998 | Smooha | |
| 5,889,309 A | 3/1999 | Yu et al. | |
| 5,895,960 A | 4/1999 | Fritz et al. | |

(Continued)

FOREIGN PATENT DOCUMENTS

TW    451301    8/2001

OTHER PUBLICATIONS

International Search Report in PCT/EP2009/067495, May 11, 2010, 5 pages.

(Continued)

*Primary Examiner* — Zandra Smith
*Assistant Examiner* — Khanh Duong
(74) *Attorney, Agent, or Firm* — Richard Kotulak; Roberts Mlotkowski Safran & Cole, P.C.

(57) ABSTRACT

Disclosed are methods for forming a thin film resistor and terminal bond pad simultaneously. A method includes simultaneously forming a terminal bond pad on a terminal wire and a thin film resistor on two other wires.

16 Claims, 8 Drawing Sheets

(56) References Cited

U.S. PATENT DOCUMENTS

| | | |
|---|---|---|
| 5,907,180 A | 5/1999 | Johansson et al. |
| 5,912,507 A | 6/1999 | Dunn et al. |
| 5,917,348 A | 6/1999 | Chow |
| 5,925,922 A | 7/1999 | Rountree et al. |
| 5,962,151 A | 10/1999 | Pasziet et al. |
| 5,977,596 A | 11/1999 | Rountree et al. |
| 6,034,427 A | 3/2000 | Lan et al. |
| 6,046,433 A | 4/2000 | Gross et al. |
| 6,049,470 A | 4/2000 | Weale |
| 6,194,764 B1 | 2/2001 | Gossner et al. |
| 6,240,535 B1 | 5/2001 | Farnworth et al. |
| 6,304,423 B1 | 10/2001 | Long et al. |
| 6,320,232 B1 | 11/2001 | Gossner et al. |
| 6,351,363 B1 | 2/2002 | Wang |
| 6,365,498 B1 | 4/2002 | Chu et al. |
| 6,437,651 B2 | 8/2002 | Chigira et al. |
| 6,452,342 B1 | 9/2002 | Ohno |
| 6,486,051 B1 | 11/2002 | Sabin et al. |
| 6,566,171 B1 | 5/2003 | Liu et al. |
| 6,605,956 B2 | 8/2003 | Farnworth et al. |
| 6,639,772 B2 | 10/2003 | Chuang et al. |
| 6,660,624 B2 | 12/2003 | Tzeng et al. |
| 6,664,141 B1 | 12/2003 | Castagnetti et al. |
| 6,707,680 B2 | 3/2004 | Schaper |
| 6,731,110 B2 | 5/2004 | Church |
| 6,737,745 B2 | 5/2004 | Sabin et al. |
| 6,747,940 B2 | 6/2004 | Ohno |
| 6,801,048 B2 | 10/2004 | Farnworth et al. |
| 6,828,653 B1 | 12/2004 | Castagnetti et al. |
| 6,876,028 B1 | 4/2005 | Coolbaugh et al. |
| 6,890,810 B2 * | 5/2005 | Amadon et al. ............ 438/210 |
| 6,973,837 B2 | 12/2005 | Barnett |
| 6,983,535 B2 | 1/2006 | Crockett et al. |
| 7,012,192 B2 | 3/2006 | Stevenson et al. |
| 7,034,560 B2 | 4/2006 | Farnworth et al. |
| 7,038,571 B2 | 5/2006 | Dunn et al. |
| 7,038,900 B2 | 5/2006 | Stevenson et al. |
| 7,042,232 B1 | 5/2006 | Jacobs |
| 7,087,977 B2 | 8/2006 | Nakayama et al. |
| 7,144,490 B2 | 12/2006 | Cheng et al. |
| 7,145,218 B2 | 12/2006 | Eshun |
| 7,164,567 B2 | 1/2007 | Litwin et al. |
| 7,193,255 B2 | 3/2007 | Asano |
| 7,199,446 B1 | 4/2007 | Mei et al. |
| 7,205,173 B2 | 4/2007 | Brunson et al. |
| 7,217,981 B2 * | 5/2007 | Coolbaugh et al. ............ 257/380 |
| 7,265,433 B2 | 9/2007 | Pillai et al. |
| 7,301,436 B1 | 11/2007 | Hopper et al. |
| 7,310,216 B2 | 12/2007 | Stevenson et al. |
| 7,375,021 B2 | 5/2008 | Edelstein et al. |
| 7,394,110 B2 * | 7/2008 | Coolbaugh et al. ............ 257/154 |
| 7,528,048 B2 * | 5/2009 | Coolbaugh et al. ............ 438/382 |
| 2002/0037643 A1 | 3/2002 | Ishimaru |
| 2002/0084526 A1 | 7/2002 | Kasai |
| 2003/0164532 A1 | 9/2003 | Liu et al. |
| 2005/0067701 A1 | 3/2005 | Coolbaugh et al. |
| 2005/0134240 A1 | 6/2005 | McClure |
| 2005/0156278 A1 | 7/2005 | Coolbaugh et al. |
| 2006/0057831 A1 | 3/2006 | Daubenspeck et al. |
| 2006/0066328 A1 | 3/2006 | Clegg et al. |
| 2006/0087400 A1 * | 4/2006 | Chinthakindi et al. ....... 338/309 |
| 2006/0118963 A1 | 6/2006 | Yamada |
| 2006/0208360 A1 | 9/2006 | Yiu et al. |
| 2007/0040239 A1 | 2/2007 | Chinthakindi et al. |
| 2009/0206460 A1 | 8/2009 | Reyes et al. |

OTHER PUBLICATIONS

International Preliminary Report on Patentability and Written Opinion in PCT/EP2009/067495, Jun. 29, 2011, 12 pages.

* cited by examiner

METHOD FOR FORMING THIN FILM RESISTOR AND TERMINAL BOND PAD SIMULTANEOUSLY

FIELD OF THE INVENTION

The invention generally relates to semiconductor devices, and more particularly to thin film resistors and terminal bond pads and methods of forming thin film resistors and terminal bond pads simultaneously.

BACKGROUND

In semiconductor manufacturing, a fabricated integrated circuit (IC) device is typically assembled into a package to be utilized on a printed circuit board as part of a larger circuit. In order for the leads of the package to make electrical contact with the bonding pads of the fabricated IC device, a metal bond (e.g., wire bond) is formed to make a connection between the bonding pad of the IC device and a lead extending to the package lead frame. In other configurations, such as a controlled collapse chip connection (C4), a solder ball connection is made to a ceramic or polymeric chip carrier.

In conventional wire-bond and C4 techniques, it is common to use a terminal metal (TD) aluminum pad structure between the wire in the uppermost wiring level (e.g., the terminal wire) and the wire-bond attachment or C4 ball attachment. However, the TD pad metal process involves an increased number of manufacturing steps and costs associated with the semiconductor structure. It is thus desirable to eliminate the aluminum TD pad. As such, a significant amount of research and development effort has been dedicated to the elimination of the TD layer for advanced back end of the line (BEOL) processing in an attempt to save processing costs.

In addition to bond pads, IC devices commonly include thin film resistors that are generally fabricated during BEOL processing. BEOL thin film resistors (such as tantalum nitride (TaN)) may be used to provide near-zero 1/f noise, and offer resistances that are better defined than corresponding resistors formed by diffusion into the semiconductor substrate. Additionally, resistors formed in the back end will have less parasitic capacitive coupling to the semiconductor substrate than resistors formed in the front end.

However, in current practice, the BEOL thin film resistors and TD-less bond pads are fabricated separately. Moreover, when plural devices in the uppermost wiring level each require a thin film resistor, separate processes are employed to form the respective thin-film resistors for each device. This separate fabrication results in an increased number of processing steps, which eliminates any possible realization of process cost savings that might be achievable by merely eliminating the aluminum TD pad.

Copper (Cu) interconnects are commonly used for on-chip wiring, because of low resistivity and long electromigration lifetime compared to other metals (e.g., Aluminum). However, as device dimensions shrink, the current density through the wires increases (especially in power busses), and the electromigration lifetime of Cu is no longer sufficient. Electromigration is a well known phenomena in which, generally speaking, atoms of a metal feature (e.g., wire, interconnect, via, etc.) are displaced due to the electrical current passing through the feature. The migration of atoms can result in voids in the feature, which can increase electrical resistance or cause failure of the feature, both of which negatively impact reliability of the integrated circuit.

It is common to use a refractory metal capping layer which can improve the electromigration lifetime of Cu. For example, CoWP (e.g., deposited selectively using electroless deposition) can improve the electromigration lifetime of Cu by over one hundred times than that of uncapped Cu. However, the selective deposition process used to form such capping layers are difficult to control, and leakage is often observed between neighboring lines due to inadvertent metal deposition on the dielectric.

Accordingly, there exists a need in the art to overcome the deficiencies and limitations described hereinabove.

SUMMARY

In a first aspect of the invention, there is a method of forming a semiconductor structure, the method comprising simultaneously forming a terminal bond pad on a terminal wire and a thin film resistor on two other wires.

In another aspect of the invention, there is a method of forming a semiconductor structure. The method comprises: forming a diffusion barrier capping layer on an uppermost wiring level in which a plurality of wires are formed; forming an isolation layer on the diffusion barrier capping layer; forming openings in the diffusion barrier capping layer and the isolation layer over the plurality of wires; forming a layer of refractory metal over exposed upper surfaces of the isolation layer and the plurality of wires; and removing portions of the layer of refractory metal while leaving other portions of the layer of refractory metal on the plurality of wires.

In another aspect of the invention, there is a semiconductor structure comprising: a last wiring level including a terminal wire, two related wires, and another wire formed in a dielectric material layer; at least one of a diffusion barrier layer and an isolation layer formed on the dielectric material layer; a terminal bond pad formed on the terminal wire; a thin film resistor formed on and conductively linking the two related wires; a cap formed on the other wire; a passivation layer formed over the terminal bond pad, the thin film resistor, and the cap; and an opening formed in the passivation layer over the terminal bond pad. The terminal bond pad, the thin film resistor, and the cap are composed of portions of a common layer of refractory metal.

In another aspect of the invention, there is a method of forming a semiconductor device. The method includes: simultaneously forming a thin film resistor and a refractory metal cap over a lower wire, wherein the lower wire is in an intermediate wiring level (n); forming a next wiring level (n+1) over the thin film resistor and the cap; forming an upper wire in the next wiring level (n+1) conductively connected to the cap; and forming two related wires in the next wiring level (n+1) conductively connected to the thin film resistor.

In another aspect of the invention, there is a semiconductor structure comprising: an intermediate wiring level comprising a first wire; a barrier layer including at least one of a diffusion barrier layer and an isolation oxide layer formed over the intermediate wiring level; a cap formed on an upper surface of the first wire; a thin film resistor formed on the barrier layer; a next wiring level formed over the cap and the thin film resistor; a second wire formed in the next wiring level and in electrical contact with the cap; and third and fourth wires formed in the next wiring level and in electrical contact with the thin film resistor. The cap and the thin film resistor are composed of portions of a common layer of refractory metal.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention generally relates to semiconductor devices, and more particularly to thin film resistors and terminal bond pads and methods of forming thin film resistors and terminal bond pads simultaneously. In embodiments, a refractory metal capping layer is formed over the entire uppermost wiring level of an IC device. The refractory metal capping layer is patterned (e.g., etched) to remove material from unwanted areas, thereby leaving the refractory metal over designated features (e.g., last level Cu wires). The remaining refractory metal may serve, for example, as a bond pad for an external connection, as a precision thin film resistor for radio frequency (RF) circuits, and as a capping layer that improves electromigration (EM) characteristics of a high current wire.

By depositing a single refractory metal capping layer and then patterning the layer, implementations of the invention provide for the simultaneous formation of bond pads, thin film resistors, and EM-improving caps. In this manner, processing steps are minimized and cost savings are realized. Moreover, processes according to aspects of the invention provide for the formation of TD-less bond pads, thin film resistors that do no increase leakage current between neighboring wires, and improved EM characteristics for Cu wires.

Figure 1:
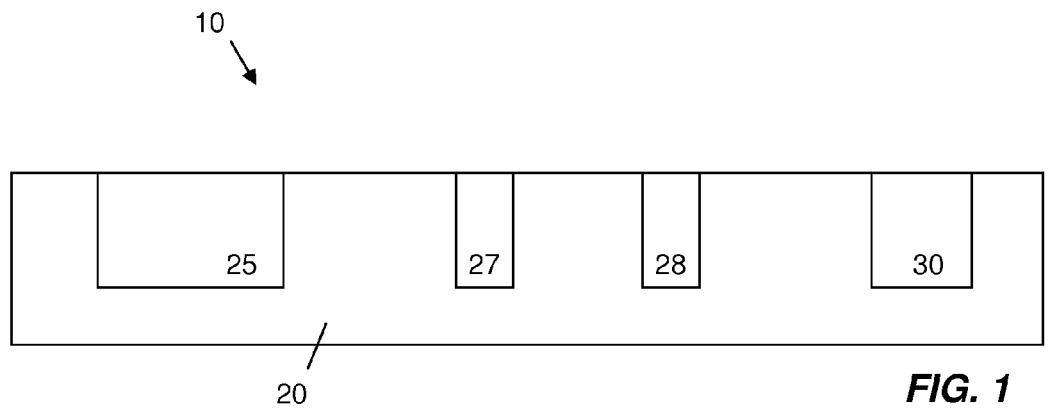
FIGS. 1-22 show structures and respective processing steps in accordance with aspects of the invention.

FIGS. 1-14 show structures and respective processing steps in accordance with aspects of the invention. Specifically, FIG. 1 shows an uppermost (e.g., last) wiring level 10 of a semiconductor structure. The last wiring level 10 comprises a dielectric material layer 20 formed atop one or more inter-level dielectric layers (not shown), which are formed atop a substrate (not shown). The last wiring level 10 also comprises wires 25, 27, 28, 30, described in greater detail herein, that are connected to active devices (not shown) formed in the substrate through various interconnect structures formed in the dielectric material layer 20 and the one or more interlevel dielectric layers.

The structure as thus described can be made using conventional techniques known to those of skill in the art. For example, the substrate may comprise a semiconductor material, an insulating material, a conductive material, or any combination thereof. When the substrate is comprised of a semiconductor material, any semiconductor material may be used, such as, for example, Si, SiGe, SiGeC, SiC, GE alloys, GaAs, InAs, InP, and other III/V or II/VI compound semiconductors. Moreover, the present invention also contemplates cases in which the substrate is a layered semiconductor, such as, for example, Si/SiGe, Si/SiC, silicon-on-insulator (SOI), or silicon germanium-on-insulator (SGOI).

When the substrate is an insulating material, the insulating material can be an organic insulator, an inorganic insulator, or a combination thereof. When the substrate is a conducting material, the substrate may include, for example, polysilicon, elemental metal, alloys of elemental metals, metal silicide, metal nitride, or combinations thereof. When the semiconductor comprises a semiconductor material, one or more semiconductor devices, such as, for example, complementary metal oxide semiconductor (CMOS) devices can be fabricated thereon.

The dielectric material layer 20 of the last wiring level 10, and any interlevel dielectric layers, may comprise any suitable dielectric material, and may be porous or non-porous. Suitable materials include, but are not limited to, $SiO_2$, $Si_3N_4$, SiCOH, silsesquioxanes, C doped oxides (i.e., organosilicates) that include atoms of Si, C, O, and/or H, thermosetting polyarylene ethers, SiLK (a polyarylene ether available from Dow Chemical Corporation), JSR (a spin-on silicon-carbon contained polymer material available from JSR Corporation), low-k materials, fluorinated silicate glass (FSG), etc., or layers thereof. The term "polyarylene" is used in this application to denote moieties or inertly substituted aryl moieties which are linked together by bonds, fused rings, or inert linking groups, such as, for example, oxygen, sulfur, sulfone, sulfoxide, carbonyl, and the like.

The wires 25, 27, 28, 30 may be formed in the dielectric material layer 20 using conventional techniques. In embodiments, the wires 25, 27, 28, 30 are composed of copper (Cu); however, the invention is not limited to use of Cu, and any suitable conductive material may be used.

According to aspects of the invention, wire 25 comprises a Cu wire that will be used with a bond pad to connect the semiconductor structure to an external device via a wire-bond attachment or C4 ball attachment. Also, in embodiments, wires 27 and 28 are associated with a high speed radio frequency (RF) device. Moreover, in embodiments, wire 30 is a high current wire, such as a power bus. Although four wires 25, 27, 28, 30 are shown, the invention is not limited to four wires, and any number of wires may be used within the scope of the invention. Additionally, the wires may be structured and configured for any desired intended use, and are not limited to the specific applications described in association with wires 25, 27, 28, 30. Furthermore, as is known in the art, after formation of the wires 25, 27, 28, 30, the top surface of the last wiring level 10 may be planarized, for example, by chemical mechanical polishing (CMP).

Figure 2:
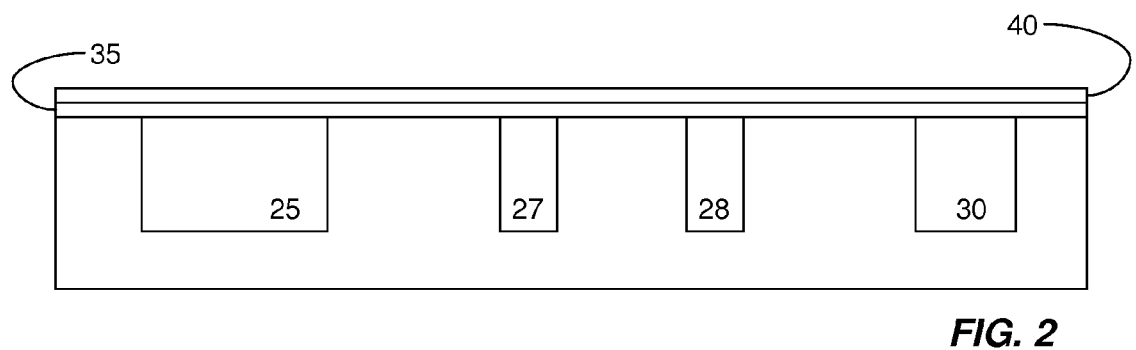

As depicted in FIG. 2, a dielectric diffusion barrier capping layer 35 is formed over the exposed upper surfaces of the dielectric material layer 20 and wires 25, 27, 28, 30. In embodiments, the diffusion barrier capping layer 35 is formed using a conventional deposition process, such as, for example, chemical vapor deposition (CVD), atomic layer deposition (ALD), physical vapor deposition (PVD), plasma enhanced chemical vapor deposition (PECVD), etc. The diffusion barrier capping layer 35 may comprise, for example, $Si_3N_4$, SiCN (e.g., nitrogen doped silicon carbide), etc., and may have any suitable thickness. In embodiments, the diffusion barrier capping layer 35 has a thickness in the range of about 15 nm to about 70 nm. However, the invention is not limited to this thickness, and any desired thickness may be used within the scope of the invention.

Still referring to FIG. 2, an isolation oxide layer 40 is formed over the dielectric diffusion barrier capping layer 35. In embodiments, the isolation oxide layer 40 is composed of $SiO_2$, and is formed using any suitable deposition technique, such as, for example, CVD, ALD, PVD, PECVD, etc. However, the invention is not limited to the use of $SiO_2$, and any suitable dielectric material may be used for the isolation oxide layer 40. In embodiments, the isolation oxide layer 40 has a thickness in the range of about 30 nm to about 500 nm. However, the invention is not limited to this thickness, and any desired thickness may be used within the scope of the invention.

Figure 3:
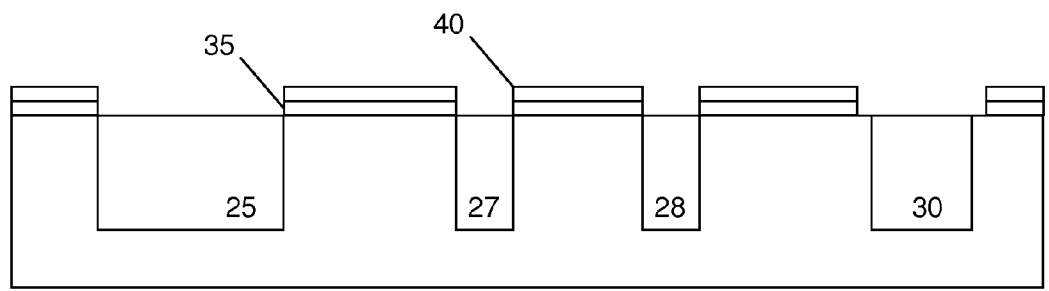

According to aspects of the invention, FIG. 3 shows that portions of the diffusion barrier capping layer 35 and isolation oxide layer 40 are removed to expose portions of the wires 25, 27, 28, 30. This may be accomplished in any suitable manner, including, but not limited to, photolithographic masking and subsequent plasma reactive ion etching (RIE) to selectively remove portions of the diffusion barrier capping layer 35 and isolation oxide layer 40.

Figure 4:
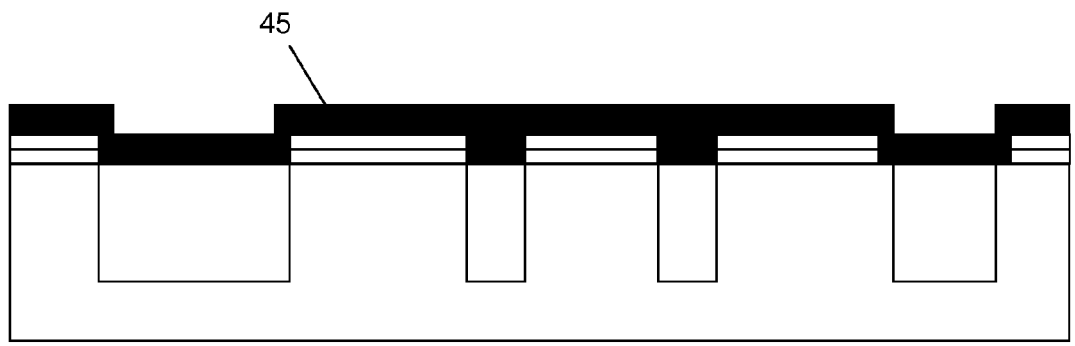

As depicted in FIG. 4, a resistor film 45 is deposited over the exposed upper surfaces of the device. In embodiments, the resistor film 45 comprises tantalum nitride (TaN). However, the invention is not limited to TaN, and any suitable refractory metal or alloy thereof may be used. The resistor film 45 may be deposited in any known manner, including PVD, CVD, AVD, spin-on coating, etc. In embodiments, the resistor film 45 has a thickness in the range of about 30 nm to about 100 nm. However, the invention is not limited to this thickness, and any desired thickness may be used within the scope of the invention.

Figure 5:
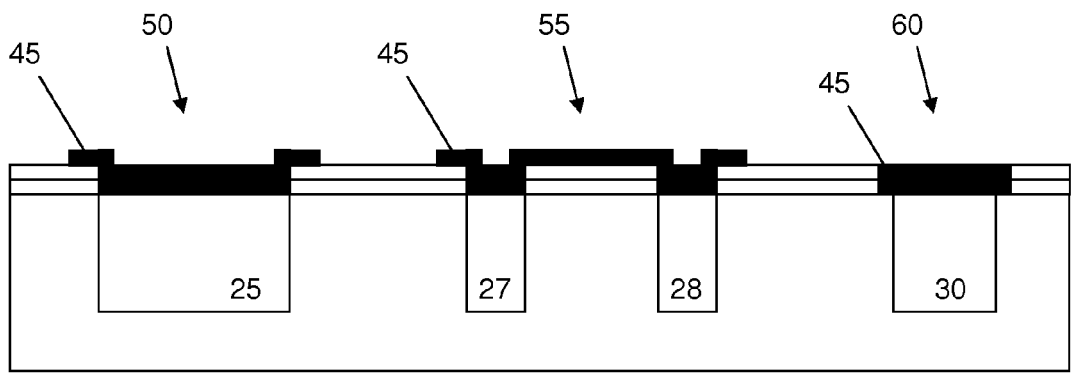

In accordance with further aspects of the invention, and as shown in FIG. 5, portions of the resistor film 45 are selectively removed, after which the remaining portions of the resistor film 45 form a bond pad 50 over wire 25, a resistor 55 over connecting wires 27 and 28, and an EM cap 60 over wire 30. Conventional lithographic masking and RIE etching may be used to remove the portions of the resistor film 45. In this manner, by first depositing a single resistor film 45 over the entire structure and then performing a single masking and etching of the deposited resistor film 45, the bond pad 50, resistor 55, and EM cap 60 are formed substantially simultaneously. This minimizes processing steps involved in fabricating such different features on the same semiconductor structure.

Figure 6:
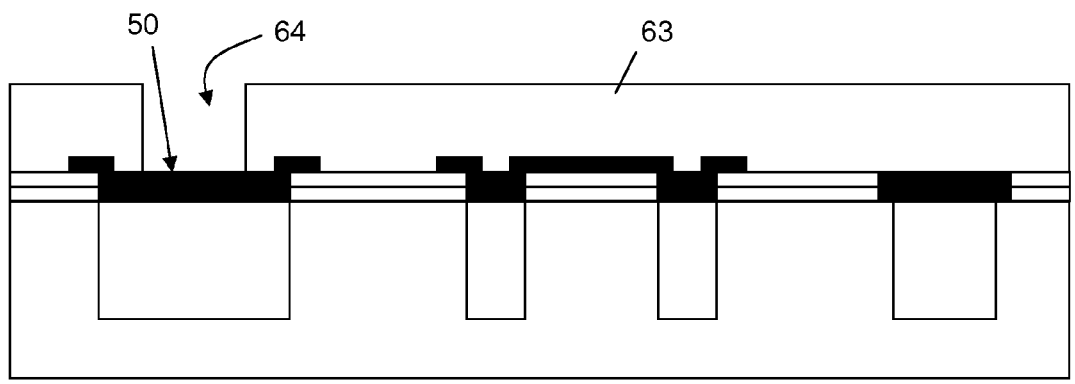

FIG. 6 shows a subsequent processing step of forming a passivation layer 63 on the exposed upper surfaces of the structure. In embodiments, the passivation layer 63 comprises photosensitive polyimide (PSPI), although the invention is not limited to this material, and any suitable material may be used. As further depicted in FIG. 6, a trench 64 may be formed using conventional techniques in passivation layer 63 to expose a surface of the bond pad 50.

Figure 7:
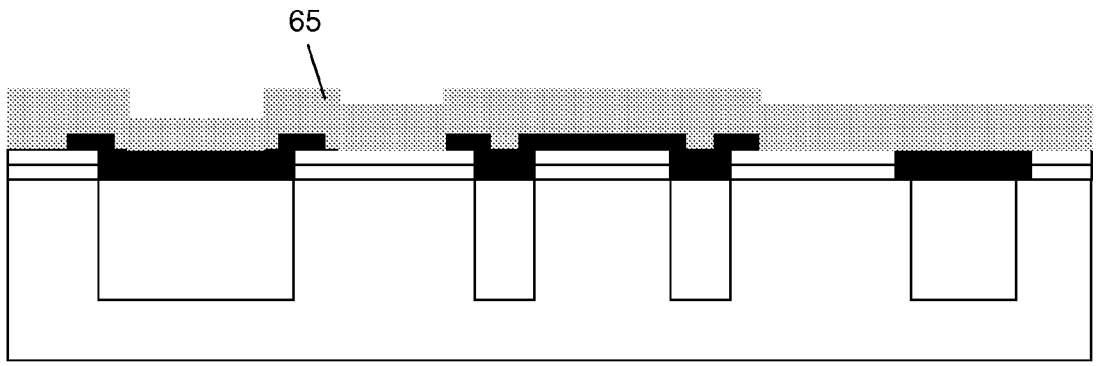

Optionally, after formation of the bond pad 50 but before forming the passivation layer 63, an additional pad film may be formed on the bond pad. More specifically, using FIG. 5 as a starting point, FIG. 7 shows a pad film layer 65 formed over the exposed upper surfaces of the device. The pad film layer 65 may comprise, for example, aluminum (Al), aluminum alloys (e.g., AlCu), or any other suitable material. The pad film layer 65 may be formed using conventional deposition techniques, including, but not limited to, PVD, CVD, AVD, spin-on coating, etc. In embodiments, the pad film layer 65 has a thickness in the range of about 300 nm to about 2000 nm. However, the invention is not limited to this thickness, and any desired thickness may be used within the scope of the invention.

Figure 8:
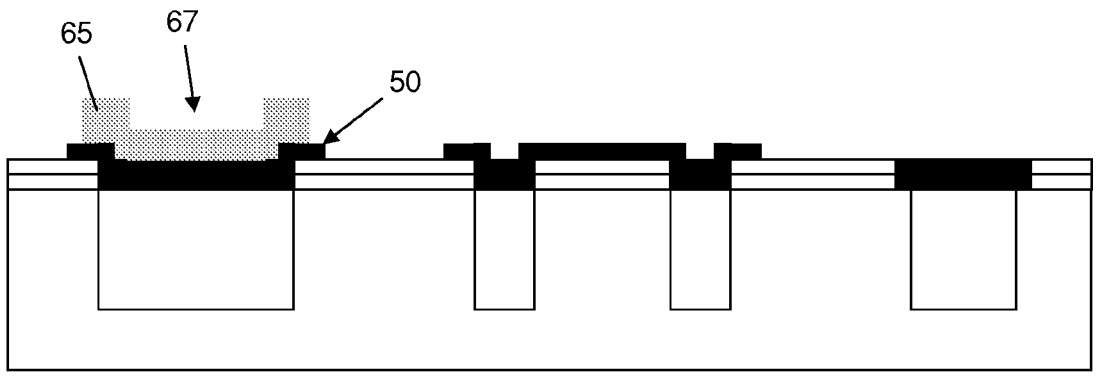
Figure 9:
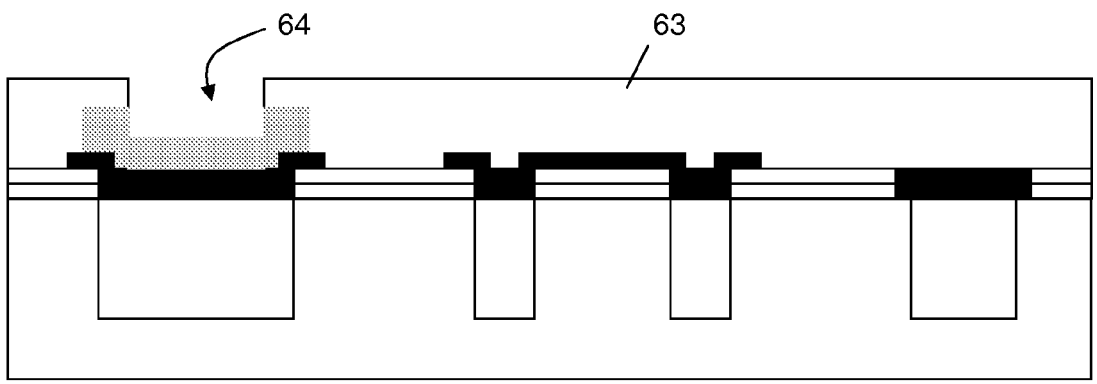

In embodiments, as depicted in FIG. 8, the pad film layer 65 is masked and etched, for example, using photolithographic masking and wet etching techniques that are selective to the pad film layer 65, to produce a pad film 67 on the bond pad 50. Subsequently, as shown in FIG. 9, a passivation layer 63 having a trench 64 may be formed in a manner similar to that described with respect to FIG. 6.

Although the pad film 67 is described above as being formed using deposition, masking, and selective wet etch techniques, other methods may be used to form the pad film 67. For example, conventional lift-off techniques may be used to form the pad film 67 on the bond pad 50. Particularly, lift-off may be used to form an AlCu pad film 67 over a TaN bond pad 50. Alternatively, the pad film 67 may be formed using damascene processes.

Figure 10:
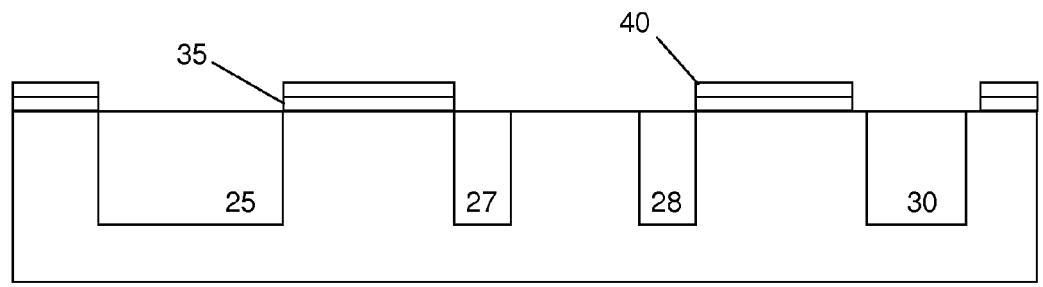

In an alternative embodiment, the diffusion barrier capping layer and isolation oxide layer are removed from the upper surface of the dielectric material layer in the vicinity of the thin film resistor, such that no portion of the diffusion barrier capping layer and isolation oxide layer exists underneath the thin film resistor. More specifically, using the intermediate structure shown in FIG. 2 as a starting point, FIG. 10 shows that portions of the diffusion barrier capping layer 35 and isolation oxide layer 40 may be removed including removal of portions between the wires 27 and 28. The removal may be performed using techniques similar to those described with respect to FIG. 3.

Figure 11:
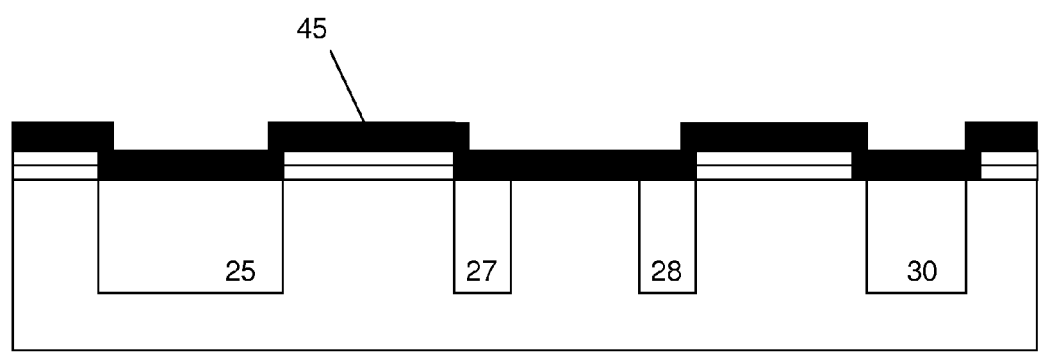
Figure 12:
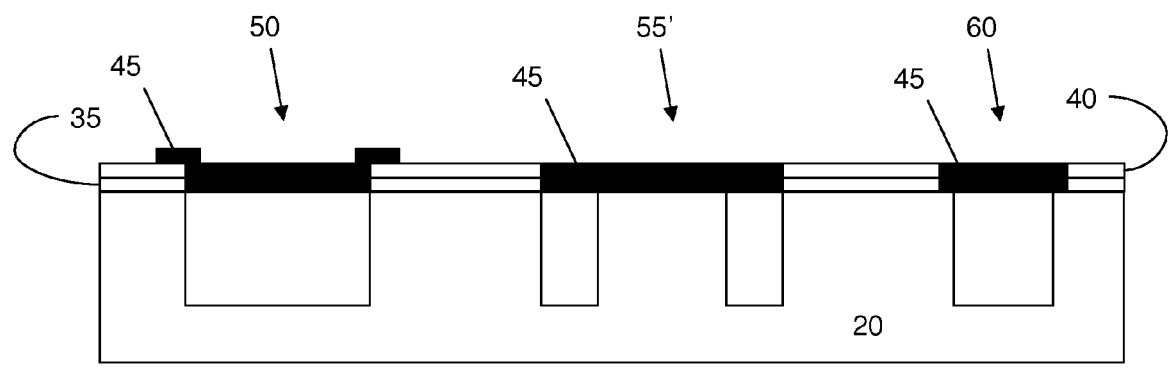

Subsequently, as shown in FIG. 11, the resistor film 45 is deposited (e.g., in a manner similar to FIG. 4). In FIG. 12, the resistor film 45 is etched (e.g., in a manner similar to FIG. 5) to simultaneously create bond pad 50, thin film resistor 55', and EM cap 60. Thin film resistor 55' differs from thin film resistor 55 in that thin film resistor 55' is formed directly on the surface of the dielectric layer 20, without any portion of the diffusion barrier capping layer 35 and isolation oxide layer 40 existing between the thin film resistor 55' and the dielectric material layer 20.

Figure 13:
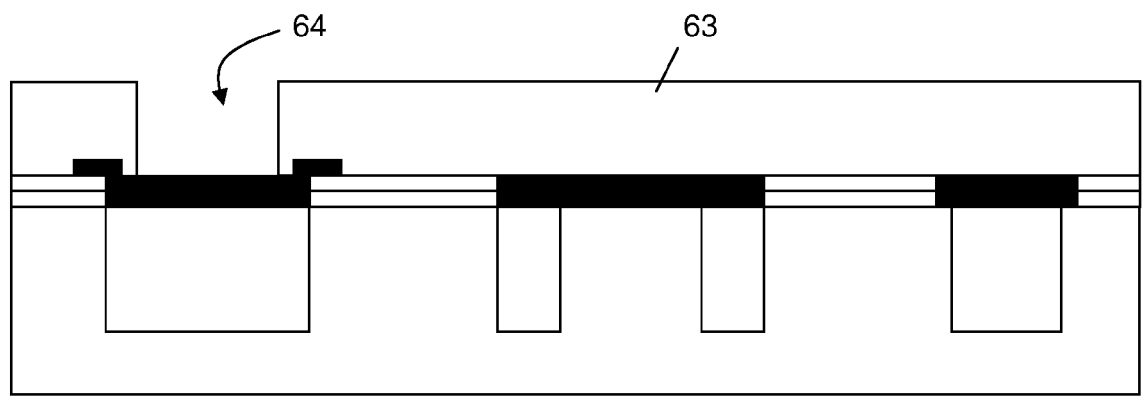
Figure 14:
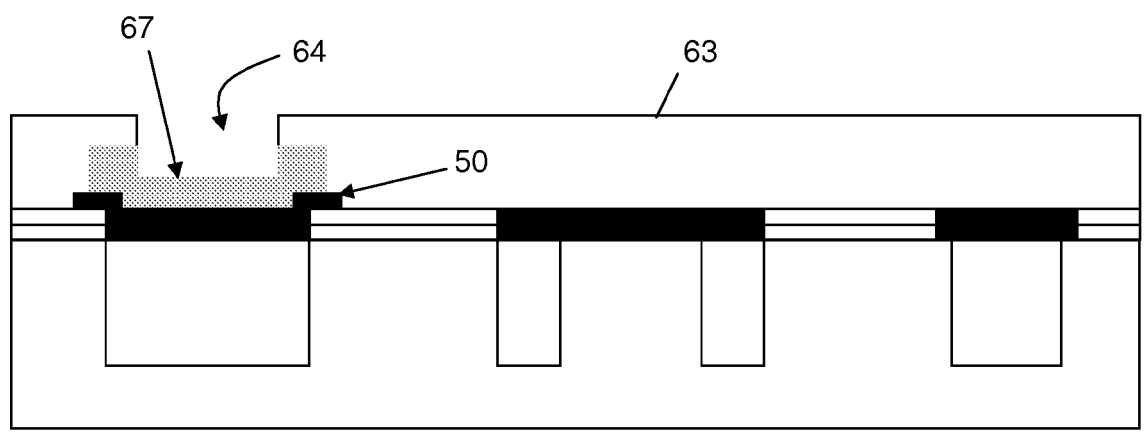

Thereafter, a passivation layer 63 having a trench 64 may be formed, as shown in FIG. 13. Optionally, a pad film 67 may be formed on the bond pad 50 prior to formation of the passivation layer 63 and trench 64, as shown in FIG. 14. The passivation layer 63, trench 64, and optional film pad 67 shown in FIGS. 13 and 14 may be formed using techniques described herein.

Figure 15:
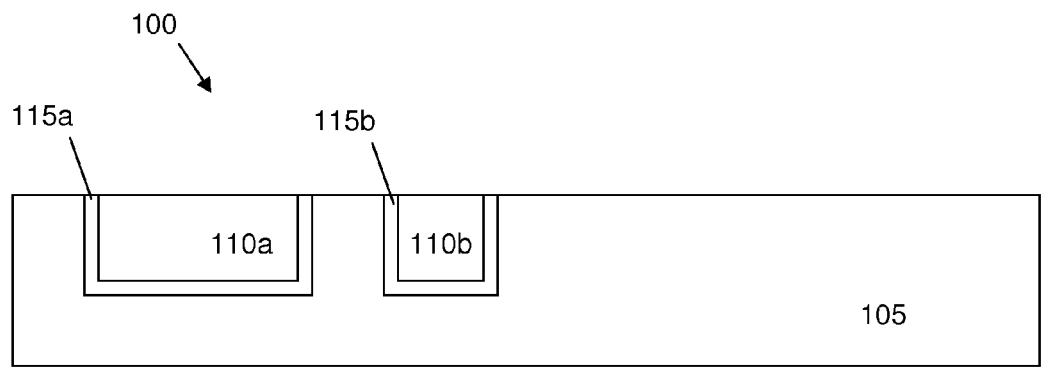

FIGS. 15-22 show structures and respective processing steps for forming thin film resistors between wiring levels in accordance with aspects of the invention. Specifically, FIG. 15 shows an interlevel wiring level 100 comprising a layer of dielectric material 105 and wires 10a, 10b, which may be formed in a similar manner and using similar materials as layer 20 and wires 25, 27, 28, and 30 described herein. Interlevel wiring level 100 may comprise any suitable wiring level in a semiconductor structure, and may be referred to, for example, as level (n). In embodiments, liners 115a, 115b may be formed between the dielectric material 105 and wires 110a, 110b. Liners are known, such that further explanation is not believed necessary. Moreover, in embodiments, the top surface of the interlevel wiring level 110 may be polished and planarized using CMP.

Figure 16:
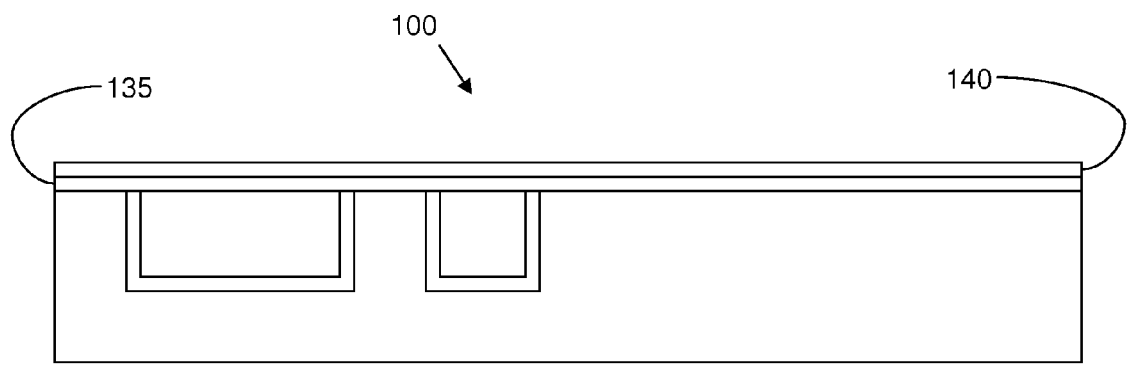

FIG. 16 shows the formation of diffusion barrier capping layer 135 and isolation oxide layer 140 on the top surfaces of the interlevel wiring level 100. The diffusion barrier capping layer 135 and isolation oxide layer 140 may be formed in a similar manner and using similar materials as diffusion barrier capping layer 35 and isolation oxide layer 40 described herein.

Figure 17:
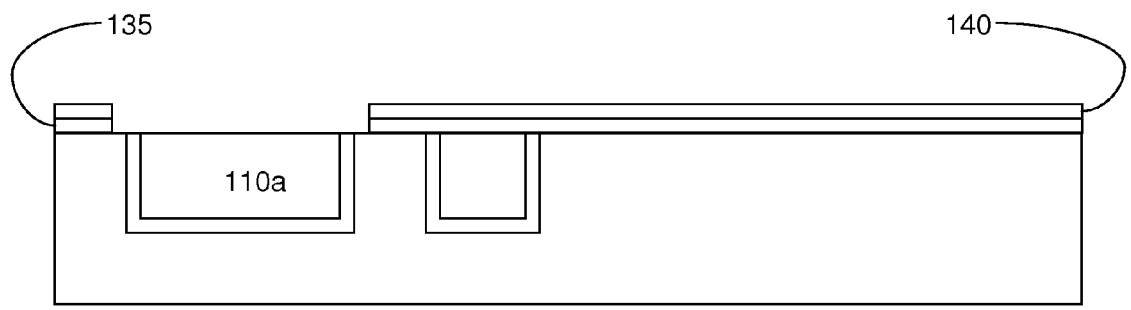

FIG. 17 depicts the removal of a portion of the diffusion barrier capping layer 135 and isolation oxide layer 140 over the first wire 110a. This removal of material may be performed using photolithographic masking and plasma RIE etching technique (similar to FIG. 3) to expose the upper surface of wire 110a.

Figure 18:
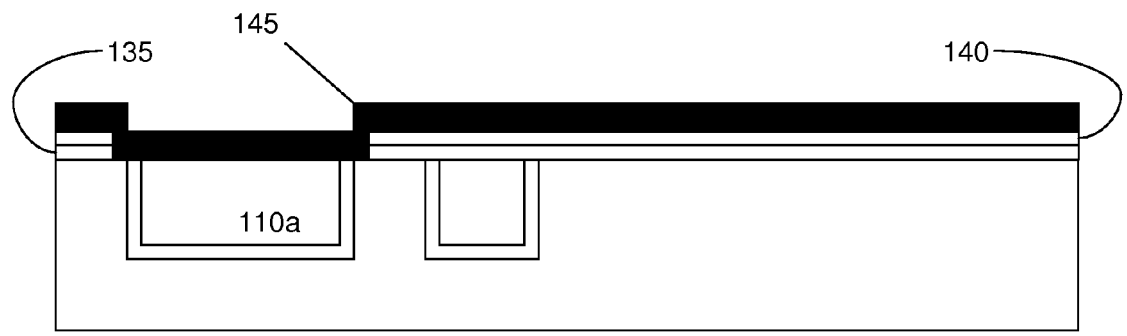

FIG. 18 shows the formation of a resistor film 145 on exposed surfaces of the diffusion barrier capping layer 135, isolation oxide layer 140, and wire 110a. The resistor film 145 may be formed in the same manner as resistor film 45 described in FIG. 4, for example, by deposition of TaN or other suitable refractory metal or alloy thereof.

Figure 19:
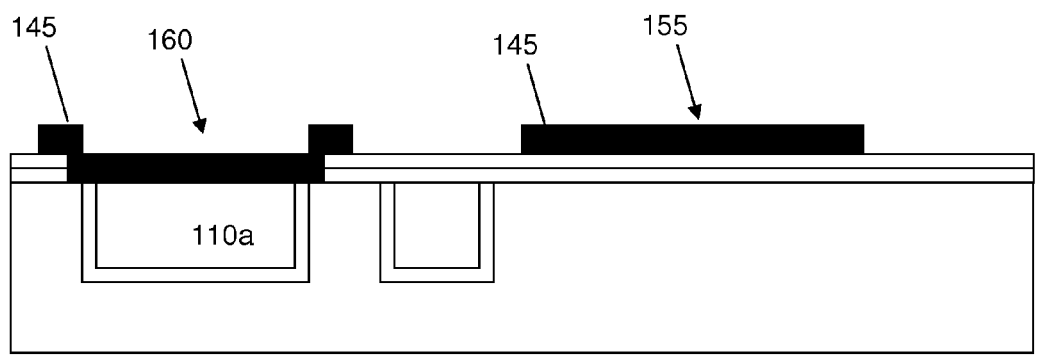

FIG. 19 shows removal of selected portions of the resistor film 145. This removal of material may be performed using photolithographic masking and RIE etching techniques similar that described in FIG. 5. The removal of portions of the resistor film 145 results in the simultaneous formation of a thin film resistor 155 and a cap 160 over the wire 110a.

Figure 20:
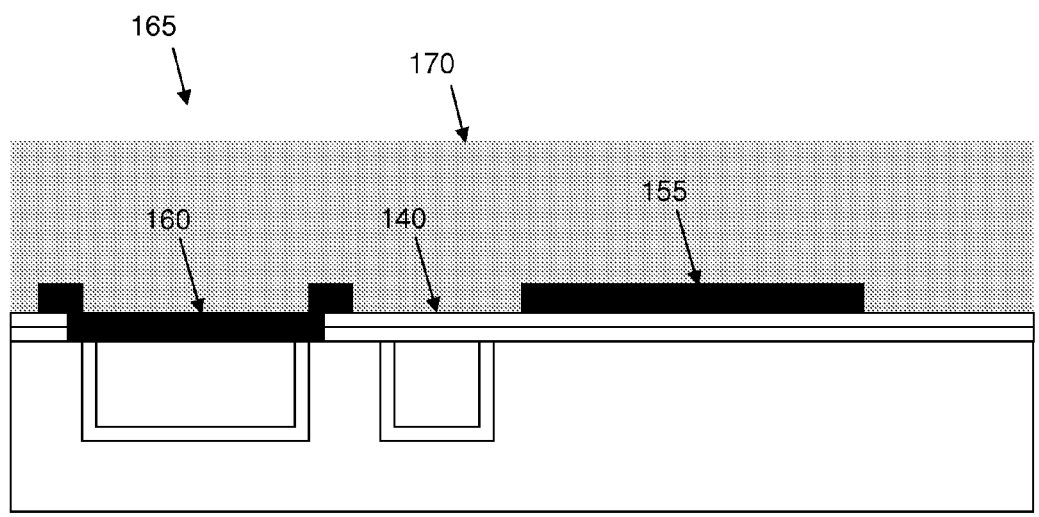

As depicted in FIG. 20, a next wiring level 165 is formed by forming another interlevel dielectric film 170 over the exposed portions of the isolation oxide layer 140, thin film resistor 155 and a cap 160. Next wiring level 165 may comprise any wiring level in a semiconductor structure, and may be referred to, for example, as level (n+1). The dielectric film 170 may be composed of any suitable dielectric material, and may be formed using conventional deposition techniques, such as, for example, those described with respect to dielectric material layer 20. In embodiments, the dielectric film 170 is composed of SiCOH; however, the invention is not limited to this material, and any suitable material may be used.

Figure 21:
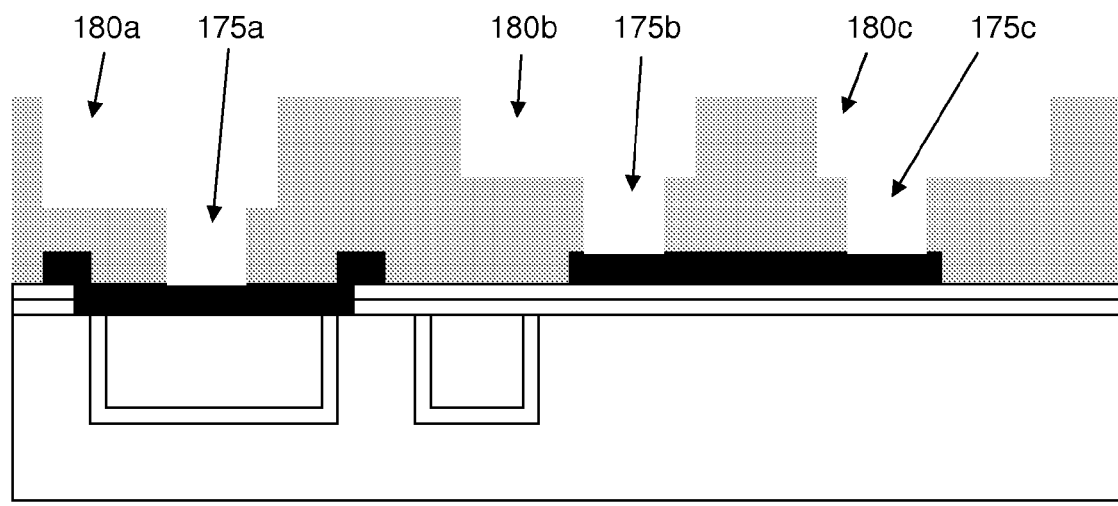
Figure 22:
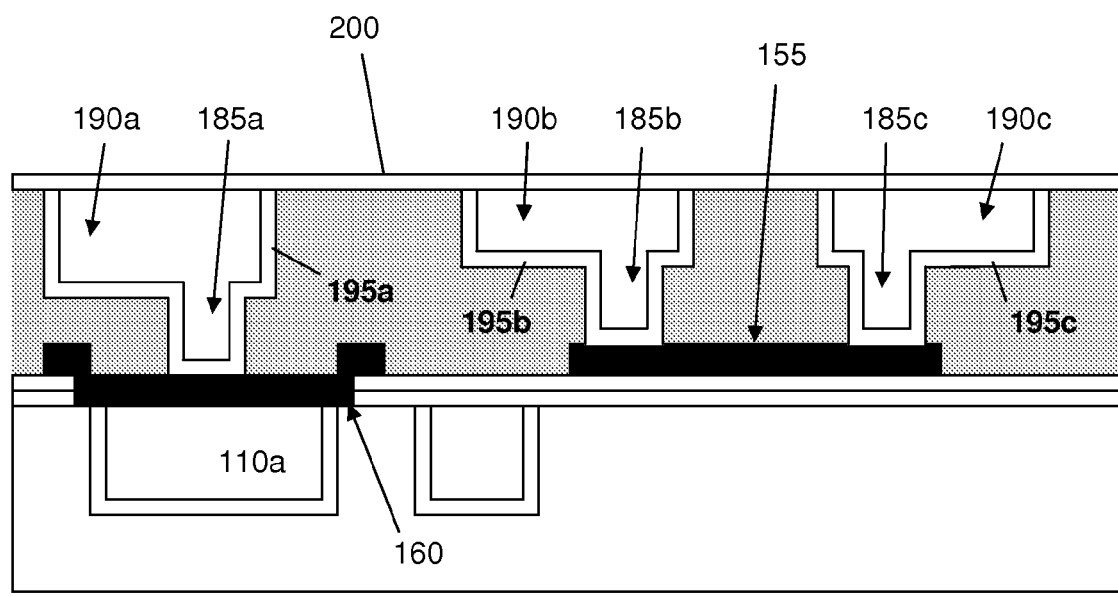

FIG. 21 shows the formation of via trenches 175a-c and wire trenches 180a-c, which may be formed using standard patterning and etching techniques, including, but not limited to, damascene processes. FIG. 22 shows the formation of vias 185a-c and wires 190a-c in the via trenches 175a-c and wire trenches 180a-c. The vias 185a-c and wires 190a-c may be formed using conventional techniques, and may be composed of any suitable material, including, but not limited to, Cu, Al, AlCu, etc. As additionally depicted in FIG. 22, liners 195a-c may optionally be formed in the via trenches 175a-c and wire trenches 180a-c before the via trenches 175a-c and wire trenches 180a-c are filled with the conductive material that forms the vias 185a-c and wires 190a-c.

Also, another diffusion barrier capping layer 200 may be formed over the exposed upper surfaces of the structure. The diffusion barrier capping layer 200 may comprise, for example, $Si_3N_4$ or SiCN (although it is not limited to these materials), and may be formed using deposition techniques described herein.

As depicted in FIG. 22, the thin film resistor 155 provides a conductive path between the terminals of wires 190b and 190c. The thin film resistor 155, being composed of TaN, provides a more desirable resistivity than a standard connection (e.g., Cu, Al, AlCu, etc.) between the two wires 190b and 190c.

As further depicted in FIG. 22, the cap 160 improves the EM performance of wire 110a, while still providing an electrical connection between the wire 110a and via 185a. In this manner, implementations of the invention may be used to provide a refractory metal cap (e.g., cap 160) cap over power busses (e.g., relaxed pitch), and a dielectric material cap (e.g., SiCN cap) over signal wires (e.g., minimum pitch).

Moreover, according to aspects of the invention, the interlevel thin film resistor 155 and the interlevel cap 160 are formed simultaneously. In this manner, embodiments of the invention provide for a reduction in the number of processing steps.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, where applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of forming a semiconductor structure, comprising:
   simultaneously forming a terminal bond pad on a terminal wire and a thin film resistor on two other wires, wherein the simultaneously forming comprises depositing a film and performing a single masking and etching of the deposited film; and
   forming a cap over a high current wire simultaneously with the terminal bond pad and the thin film resistor, wherein the cap reduces electromigration effects in the high current wire.

2. A method of forming a semiconductor structure, comprising:
   simultaneously forming a terminal bond pad on and directly contacting a terminal wire and a thin film resistor on two other wires; and
   forming a pad film on the terminal bond pad,
   wherein the terminal wire is over a substrate,
   the terminal bond pad is over the terminal wire, and
   the pad film is an electrically conductive material and is configured to be connected to a wire bond or controlled collapse chip connection (C4) solder ball attachment.

3. The method of claim 2, wherein the semiconductor structure is devoid of a terminal metal (TD) aluminum pad structure.

4. A method of forming a semiconductor structure, comprising:
   simultaneously forming a terminal bond pad on and directly contacting a terminal wire and a thin film resistor on two other wires; and
   forming a pad film on the terminal bond pad,
   wherein the terminal wire is over a substrate,
   the terminal bond pad is over the terminal wire, and
   the forming the pad film comprises:
      depositing a pad film layer over substantially all exposed upper surfaces of the semiconductor structure;
      photolithographic masking the pad film layer; and
      etching away portions of the pad film layer to form the pad film.

5. A method of forming a semiconductor structure, comprising:
   simultaneously forming a terminal bond pad on and directly contacting a terminal wire and a thin film resistor on two other wires; and
   forming a pad film on the terminal bond pad,
   wherein the terminal wire is over a substrate,
   the terminal bond pad is over the terminal wire, and
   the forming the pad film comprises:
      forming photoresist over selected exposed upper surfaces of the semiconductor structure, leaving at least a portion of the terminal bond pad exposed;
      depositing a pad film layer over the photoresist and the exposed portion of the terminal bond pad; and
      lifting off the photoresist.

6. A method of forming a semiconductor structure, comprising:
   simultaneously forming a terminal bond pad on and directly contacting a terminal wire and a thin film resistor on two other wires; and
   forming a pad film on the terminal bond pad,
   wherein the terminal wire is over a substrate,
   the terminal bond pad is over the terminal wire, and
   the forming the pad film comprises fabricating the pad film on the terminal bond pad using damascene processes.

7. A method of forming a semiconductor structure, comprising:
   forming a diffusion barrier capping layer on an uppermost wiring level in which a plurality of wires are formed;
   forming an isolation layer on the diffusion barrier capping layer;
   forming openings in the diffusion barrier capping layer and the isolation layer over the plurality of wires;
   forming a layer of refractory metal in the openings and on exposed upper surfaces of the isolation layer and the plurality of wires; and
   removing portions of the layer of refractory metal while leaving other portions of the layer of refractory metal in the openings and on the plurality of wires.

8. The method of claim 7, wherein:
   the plurality of wires comprises a terminal wire, two related wires, and another wire, and
   the removing portions of the layer of refractory metal while leaving other portions of the layer of refractory metal in the openings and on the plurality of wires simultaneously forms: a terminal bond pad on the terminal wire, a thin film resistor between the two related wires, and a cap on the other wire.

9. The method of claim 8, wherein:
   the forming openings in the diffusion barrier capping layer and the isolation layer comprises removing portions of the diffusion barrier capping layer and the isolation layer between the two related wires; and
   the forming the layer of refractory metal comprises depositing the refractory metal on the uppermost wiring level between the two related wires.

10. The method of claim 8, further comprising forming a terminal pad film on the terminal bond pad.

11. A method of forming a semiconductor device, comprising:
    simultaneously forming a thin film resistor and a refractory metal cap over a lower wire, wherein the lower wire is in an intermediate wiring level (n) and the refractory metal cap directly contacts the lower wire, and wherein the simultaneously forming the thin film resistor and the refractory metal cap comprises depositing a resistor film and performing a single masking and etching of the deposited resistor film;
    forming a next wiring level (n+1) over the thin film resistor and the cap;
    forming at least one of a diffusion barrier capping layer and an isolation layer between the intermediate wiring level (n) and the next wiring level (n+1);
    forming an upper wire in the next wiring level (n+1) conductively connected to the cap; and
    forming two related wires in the next wiring level (n+1) conductively connected to the thin film resistor.

12. The method of claim 11, wherein the thin film resistor and the refractory metal cap comprise portions of a common layer of refractory metal.

13. The method of claim 12, wherein the refractory metal comprises tantalum nitride (TaN).

14. The method of claim 11, further comprising:
    forming a first via between the upper wire and the cap;
    forming a second via between a first one of the two related wires and the thin film resistor; and
    forming a third via between a second one of the two related wires and the thin film resistor.

15. A method of forming a semiconductor device, comprising:
    simultaneously forming a thin film resistor and a refractory metal cap over a lower wire, wherein the lower wire is in an intermediate wiring level (n);
    forming a next wiring level (n+1) over the thin film resistor and the cap;
    forming an upper wire in the next wiring level (n+1) conductively connected to the cap; and
    forming two related wires in the next wiring level (n+1) conductively connected to the thin film resistor,
    wherein the simultaneously forming comprises:
    patterning a barrier layer to expose a portion of the lower wire, wherein the barrier layer includes at least one of a diffusion barrier layer and an isolation oxide layer;
    forming a layer of refractory metal on the portion of the lower wire and the barrier layer; and
    selectively removing portions of the layer of refractory metal to form the thin film resistor and the cap.

16. A method of forming a semiconductor device, comprising:
    forming a lower wire in a dielectric material;
    forming an insulator on the lower wire and the dielectric material;
    removing a portion of the insulator to expose a portion of the lower wire;
    simultaneously forming a thin film resistor on the insulator and a refractory metal cap directly contacting the portion of the lower wire;
    forming a dielectric film on the thin film resistor and the cap;
    forming an upper wire in the dielectric film conductively connected to the cap; and
    forming two related wires in the dielectric film conductively connected to the thin film resistor.

* * * * *